United States Patent
Koerner

(10) Patent No.: US 8,049,336 B2
(45) Date of Patent: Nov. 1, 2011

(54) INTERCONNECT STRUCTURE

(75) Inventor: Heinrich Koerner, Bruckmuehl (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 12/241,083

(22) Filed: Sep. 30, 2008

(65) Prior Publication Data

US 2010/0078817 A1    Apr. 1, 2010

(51) Int. Cl.
*H01L 23/48* (2006.01)
*H01L 23/52* (2006.01)
*H01L 29/40* (2006.01)

(52) U.S. Cl. ............ 257/765; 257/751; 257/758

(58) Field of Classification Search .......... 257/750, 257/751, 758, 767, 762, 763, 770, 765, 771
See application file for complete search history.

(56) References Cited

U.S. PATENT DOCUMENTS

| | | | |
|---|---|---|---|
| 2002/0090811 A1* | 7/2002 | Kim et al. | 438/627 |
| 2006/0046453 A1* | 3/2006 | Collins et al. | 438/597 |
| 2008/0254617 A1* | 10/2008 | Adetutu et al. | 438/643 |

OTHER PUBLICATIONS

G. Van Den Bosch, S. Demuynck, Z. Tökei, G. Beyer, M. Van Hove, G. Groeseneken; Impact of copper contacts on CMOS front-end yield and reliability; 2006 IEEE; 1-4244-0439-8/06.
Wei-Min Li, Hessel Sprey, Ivo Raaijmakers, Devendra Kumar, Wonyong Koh; Meeting the Cu diffusion barrier challenge using ALD tungsten nitride carbide; Solid State Technology, The International Magazine for Semiconductor Manufacturing, 2008.

* cited by examiner

*Primary Examiner* — S. V. Clark
(74) *Attorney, Agent, or Firm* — Infineon Technologies AG; Philip Schlazer

(57) ABSTRACT

One or more embodiments relate to a semiconductor device, comprising: a Si-containing layer; a barrier layer disposed over the Si-containing layer, the barrier layer comprising a compound including a metallic element; a metallic nucleation_seed layer disposed over the barrier layer, the nucleation_seed layer including the metallic element; and a metallic interconnect layer disposed over the nucleation_seed layer, the interconnect layer comprising at least one element selected from the group consisting of Cu (copper), Au (gold), and Ag (silver).

26 Claims, 5 Drawing Sheets

US 8,049,336 B2

INTERCONNECT STRUCTURE

FIELD OF THE INVENTION

Embodiments of the present invention relate to semiconductor devices and methods for making semiconductor devices.

BACKGROUND OF THE INVENTION

Conductive interconnects are used in semiconductor technology. Certain conductive interconnects, sometimes referred to as via interconnects, may be used to electrically couple a metal (or conductive) line of a first metallization level (for example, Metal-1, Metal-2, Metal-3, etc.) to a metal (or conductive) line of another metallization level. Certain conductive interconnects, sometimes referred to as contact interconnects, may be used to provide electrical coupling between portions of a semiconductor substrate and a metal (or conductive) line of the first metallization level (e.g. Metal-1).

While pure copper or copper alloy has been used for the material of the metal lines of the metallization levels, pure tungsten has typically been used for the material of the contact interconnect between the substrate and the first metal level. When pure tungsten is used, a relatively quick increase in contact resistance may result as the diameter of the contact interconnect decreases. A new contact interconnect system is needed.

SUMMARY OF THE INVENTION

One or more embodiments relate to a semiconductor device, comprising: a Si-containing layer; a barrier layer disposed over the contact layer, the barrier layer comprising a compound including a metallic element; a metallic nucleation_seed layer disposed over the barrier layer, the nucleation_seed layer including the metallic element; and a metallic interconnect layer disposed over the nucleation_seed layer, the interconnect layer comprising at least one element selected from the group consisting of Cu (copper), Au (gold), and Ag (silver).

One or more embodiments relate to a semiconductor device, comprising: a Si-containing layer; a first layer disposed over the Si-containing layer, the first layer comprising a compound including a metallic element; a metallic second layer disposed over the first layer, the second layer including the metallic element; and a metallic interconnect layer disposed over the second layer, the interconnect layer comprising at least element selected from the group consisting of Cu (copper), Au (gold), and Ag (silver).

One or more embodiments relate to a semiconductor device, comprising: a Si-containing layer; a dielectric layer having an opening, the opening over the Si-containing layer; a first layer disposed within the opening over the Si-containing layer, the first layer comprising a compound including a metallic element; a metallic second layer disposed within the opening over the first layer, the second layer including the metallic element; and a metallic interconnect layer disposed within the opening over the second layer, the interconnect layer comprising at least one element selected from the group consisting of Cu (copper), Au (gold), and Ag (silver).

One or more embodiments relate to a method of forming a semiconductor device, comprising: providing a Si-containing layer; forming a barrier layer over the Si-containing layer, the barrier layer comprising a compound including a metallic element, the barrier layer formed by an atomic layer deposition or by a pulsed chemical vapor deposition; forming a metallic nucleation_seed layer over the barrier layer, the nucleation_seed layer including the metallic element, the nucleation_seed layer formed by an atomic layer deposition or by a pulsed chemical vapor deposition; and forming an interconnect layer over the nucleation_seed layer, the interconnect layer comprising at least one element selected from the group consisting of Cu (copper), Au (gold), and Au (silver).

One or more embodiments relate to a method of forming a semiconductor device having a substrate, comprising: providing a Si-containing layer; forming a barrier layer over the Si-containing layer, the barrier layer comprising a compound including a metallic element; forming a metallic nucleation_seed layer over the Si-containing layer, the nucleation_seed layer including the metallic element; and forming an interconnect layer over the nucleation_seed layer, the interconnect layer comprising at least one element selected from the group consisting of Cu (copper), Au (gold), and Ag (silver), the barrier layer and the nucleation_seed layer being formed without exposing the semiconductor device substrate to the ambient atmosphere.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B", "B but not A", and "A and B" (unless otherwise indicated).

Figure 1:
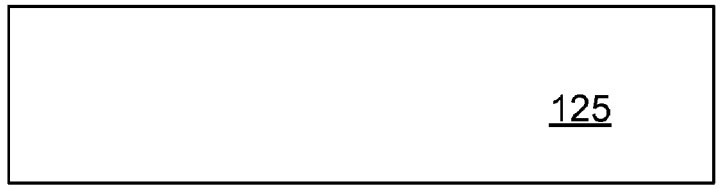
FIG. 1 through 6 show a method of making an interconnect structure in accordance with an embodiment of the present invention.

FIGS. 1 through 6 show a method for making an interconnect structure of the present invention. FIG. 1 shows a Si-containing layer 125. Generally, the Si-containing layer may be any layer comprising Si (the element silicon from the Periodic Table). This includes, without limitation, monocrystalline silicon, polycrystalline silicon, amorphous silicon, doped silicon (including, for example, doped monocrystalline silicon and doped polycrystalline silicon), silicon substrates, silicon wafers and silicides (such as metal silicides) Doping may include p-type doping and/or n-type doping.

Figure 2:
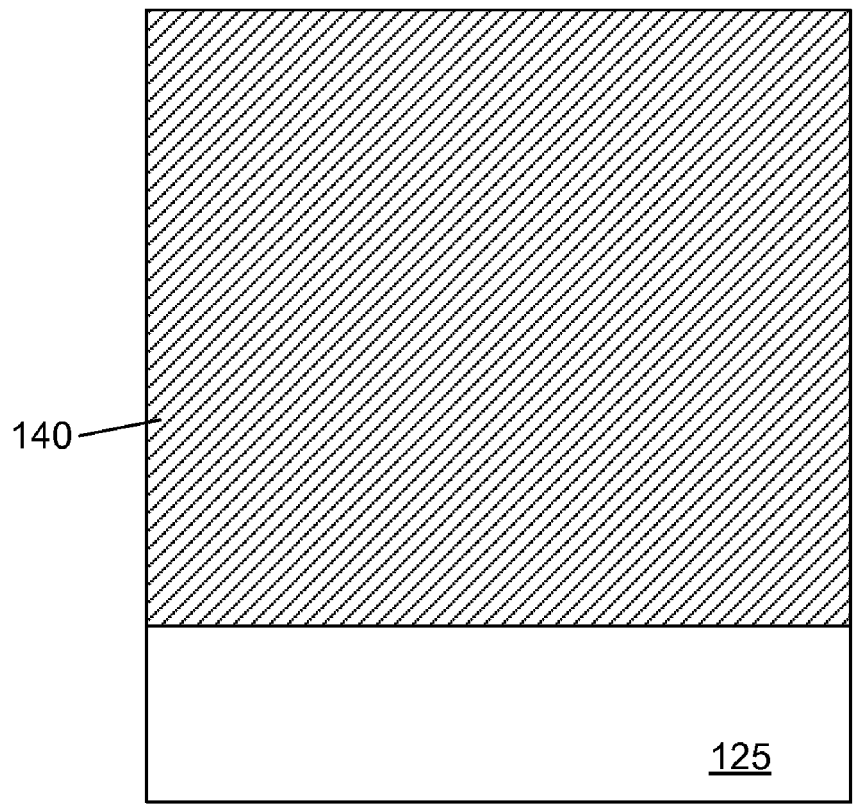

Referring to FIG. 2, a dielectric layer 140 may be formed over the Si-containing layer 125. The dielectric layer 140 may comprise, for example, an oxide, a nitride, an oxynitride, or combinations thereof. In one or more embodiments, the dielectric layer 140 may be formed on the Si-containing layer 125 so as to make direct contact with the Si-containing layer 125.

Figure 3:
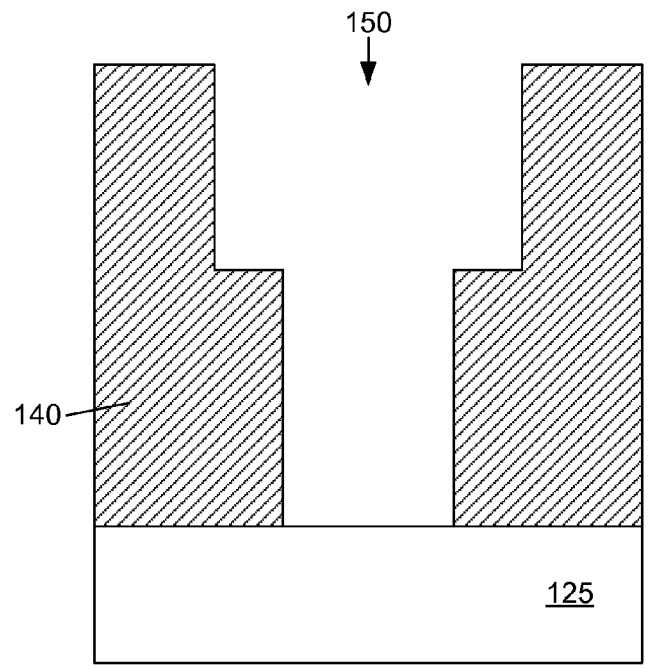

Referring to FIG. 3, an opening 150 may be formed through the dielectric 140 and over the Si-containing layer 125. In one or more embodiments, the opening 150 is formed so as to expose the Si-containing layer 125. In the embodiment shown in FIG. 3, the opening 150 has a lower portion 150L and an upper portion 150U. In one or more embodiments, the opening 150 may be formed as part of a dual Damascene approach such that the lower portion 150U is used for the formation of an interconnect while the upper portion 150U is used for the formation of a metallic (or conductive) line. In one or more embodiments, the lower portion 150L may be formed as a hole. Generally, the hole may have any shape such as round, elliptical, square or rectangular. In one or more embodiments, the upper portion 150L may be formed as a trench. Other shapes for the opening 150 are possible.

The opening 150 may include a bottom surface and at least one sidewall surface. The opening may be formed using an etching process. In one or more embodiments, the etching process may include a dry etch (such as a plasma etch). In one or more embodiments, the etching process may include a wet etch.

Figure 4:
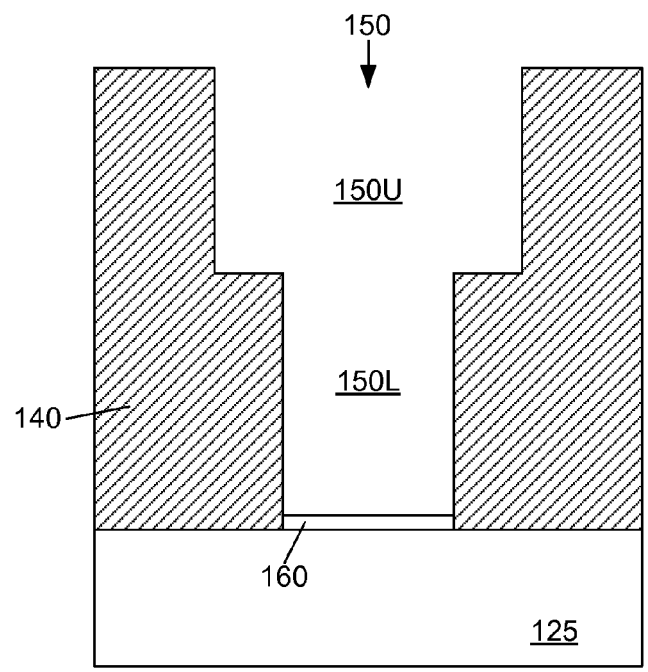

Referring to FIG. 4, a contact layer 160 may be disposed within the opening 150 and over the Si-containing layer 125. In one or more embodiments, the contact layer 160 may be formed on said Si-containing layer 125 so as to make direct contact with the Si-containing layer 125. The formation of the contact layer 160 may be a selective deposition process such that the contact layer 160 is disposed on the Si-containing layer 125 but not substantially on the surface or surfaces of the dielectric layer 140 within the opening. In one or more embodiments, the contact layer 160 may be formed using atomic layer deposition. In one or more embodiments, the contact layer 160 may be formed using pulsed chemical vapor deposition.

In another embodiment, the contact layer 160 may also be formed over the dielectric layer 140. In one or more embodiments, the contact layer 160 may be formed on the dielectric layer 140 so as to make direct contact with the dielectric layer 140.

In another embodiment, the contact layer 160 may first be deposited over (or on) the Si-containing layer 125. It may then be patterned before the deposition of the dielectric layer 140 and before the formation of the opening 150.

In one or more embodiments, the contact layer 160 may be a metallic layer. In one or more embodiments, the contact layer 160 may comprise a metallic material. In one or more embodiments, the contact layer 160 may consist essentially of a metallic material. In one or more embodiments, the metallic material of the contact layer may include at least one metallic element (from the Periodic Table of Elements). In one or more embodiments, the metallic element may be selected from the Transition metals. In one or more embodiments, the metallic element may be selected from the refractory metals. In one or more embodiments, the metallic element may be selected from the group consisting of W (tungsten), Ti (titanium), Ta (tantalum), Mo (molybdenum), and Co (cobalt). In one or more embodiments, the metallic material may include W (tungsten). In one or more embodiments, the contact layer may comprise (or consist essentially of) a pure metal and/or a metal alloy. In one or more embodiments, the contact layer may comprise (or consist essentially of) one or more materials selected from the group consisting of pure tungsten, tungsten alloy, pure titanium, titanium alloy, pure molybdenum, molybdenum alloy, pure cobalt, and cobalt alloy. In one or more embodiments, the contact layer 160 may comprise pure tungsten and/or a tungsten alloy. In one or more embodiments, the contact layer 160 may consist essentially of pure tungsten and/or a tungsten alloy. In one or more embodiments, the contact layer 160 may comprise pure tungsten. In one or more embodiments, the contact layer 160 may consist essentially of pure tungsten.

The contact layer 160 may be deposited in many different ways. One way to do the deposition is through atomic layer deposition (ALD). The ALD process may, for example, use either $WF_6/SiH_4$ or $WF_6/B_2H_6$. In this particular step, portions of $WF_6$ and $SiH_4$ or portions of $WF_6$ and $B_2H_6$ corresponding to monolayers may be alternatingly adsorbed at the surface of the Si-containing layer 125 and subsequently transformed to monolayers of metallic tungsten.

It is possible, that any native oxide layer at the open surface of the Si-containing layer 125 may be cracked, but detrimental, uncontrolled reactions of $WF_6$ with the surface of the Si-containing layer 125 may be excluded. The impact on possible differently doped silicon regions which may exist in the Si-containing layer may be negligible because reaction with the Si-containing layer may be limited to a depth of about three atomic layers or less.

The deposition of the contact layer 160 may be independent of the composition of the Si-containing layer 125. Hence, as noted, the Si-containing layer 125 may, for example, represent (without limitation) an n-doped and/or a p-doped silicon layer or it may represent a silicide layer (such as metal silicide).

As a result of the deposition of the contact layer 160 over (or on) the Si-containing layer, a smooth and clean interface may be created. This may result in a low ohmic contact and good adhesion for the formation of subsequent layers. Due to the possible selective nature of the deposition, it is thus possible that the deposition only occurs on the Si-containing layer and not on the dielectric layer 140. In another embodiment, it may be possible to deposit the contact layer 160 over (or on) both the surface of the Si-containing layer 125 as well as over (or on) the surface of the dielectric layer 140.

In one or more embodiments, the contact layer 160 may have a thickness of about 10 nm or less. In one or more embodiments, the contact layer 160 may have a thickness of about 5 nm or less.

Figure 5:
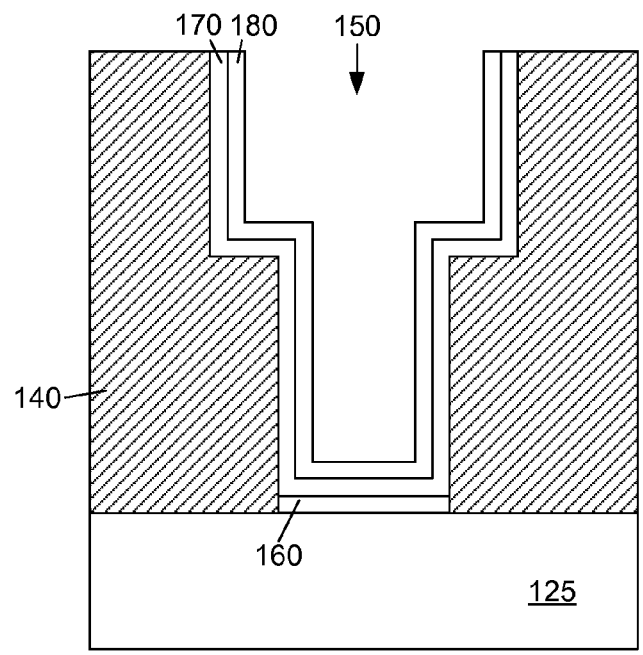

Referring to FIG. 5, a barrier layer 170 may then be formed within the opening 150 over the contact layer 160. The barrier layer 170 may also be formed within the opening 150 over the one or more surfaces of the dielectric layer 140 that define the opening 150. In one or more embodiments, the barrier layer 170 may be formed on the contact layer so as to be in direct contact. In one or more embodiments, the barrier layer may be formed on the dielectric layer 140 so as to be in direct contact. The barrier layer 170 may have a thickness of less than about 10 nm.

In one or more embodiments, the barrier layer 170 may comprise one or more compounds where each compound includes at least one metallic element. In one or more embodiments, the barrier layer 170 may consist essentially of one or more compounds where each compound includes at least one metallic element. In one or more embodiments, the metallic element may be any metallic element in the Periodic Table of Elements. In one or more embodiments, the metallic element may be a Transition metal element. In one or more embodiments, the metallic element may be a refractory metal element. In one or more embodiments, the metallic element may be chosen from the group consisting of W (tungsten), Ti (titanium), Ta (tantalum), Mo (molybdenum), and Co (cobalt). In one or more embodiments, the metallic element may be W (tungsten).

In one or more embodiments, the barrier layer may comprise (or consist essentially of) a mixture of two or more compounds.

In one or more embodiments, the barrier layer compound may include at least one non-metallic element (from the Periodic Table of the Elements). In one or more embodiments, the barrier layer compound may include at least one element selected from the group consisting of N (nitrogen), C (carbon), and Si (silicon).

In one or more embodiments, the barrier layer compound may include at least two elements. In one or more embodiments, the barrier layer may include at least three elements. In one or more embodiments, the barrier layer compound may be a binary compound. In one or more embodiments, the barrier layer compound may be a ternary compound.

In one or more embodiments, the barrier layer may comprise (or may consist essentially of) one or more compounds selected from the group consisting of metal carbide, metal nitride, metal carbon nitride, metal silicon nitride, metal silicon carbide, and metal silicon carbon nitride. In one or more embodiments, the barrier layer may comprise (or may consist essentially of) one or more compounds selected from the group consisting of metal carbide, metal nitride, metal carbon nitride, and metal silicon nitride. The one or more compounds may each comprise at least one metallic element. In one or more embodiments, the metallic element may be a Transition metal element. In one or more embodiments, the metallic element may be a refractory metal element. In one or more embodiments, the metallic element may be chosen from the group consisting of W (tungsten), Ti (titanium), Ta (tantalum), Mo (molybdenum), and Co (cobalt). In one or more embodiments, the metallic element may be W (tungsten).

In one or more embodiments, the barrier layer 170 may comprise (or may consist essentially of) at least one tungsten compound. In one or more embodiments, the tungsten compound may be a compound having two or more elements. In one or more embodiments, the tungsten compound may be a compound having three or more elements. In one or more embodiments, the compound may be a binary compound. In one or more embodiments, the compound may be a ternary compound.

In one or more embodiments, the barrier layer may comprise (or may consist essentially of) at least one compound selected from the group consisting of tungsten carbide, tungsten nitride, tungsten carbon nitride, tungsten silicon nitride, tungsten silicon carbide, and tungsten silicon carbon nitride. In one or more embodiments, the barrier layer may comprise (or may consist essentially of) at least one compound selected from the group consisting of tungsten carbide, tungsten nitride, tungsten carbon nitride, and tungsten silicon nitride. Examples of compounds which may be used include, but not limited to, $WN_x$, $WC_x$, $WC_xN_y$, and $WSi_xN_y$. In one or more embodiments, the barrier layer may comprise $WN_2$. In one or more embodiments, the barrier layer may comprise WC. In one or more embodiments, the barrier layer may comprise $W_2C$.

In one or more embodiments, the barrier layer may comprise (or may consist essentially of) a mixture of at least two materials. In one or more embodiments, the barrier layer may comprise (or may consist essentially of) a mixture of at least two compounds. In one or more embodiments, the barrier layer may comprise (or may consist essentially of) a mixture of at least two tungsten compounds.

In one or more embodiments, the barrier layer may comprise (or consist essentially of) a non-metallic material. In one or more embodiments, the barrier layer may comprise (or may consist essentially of a) at least one non-metallic compound. In one or more embodiments, the barrier layer may be a non-metallic layer. In one or more embodiments, the barrier layer may comprise (or may consist essentially of) a ceramic material.

In one or more embodiments, the barrier layer material may comprise at least one element selected from the group consisting of W (tungsten), Ti (titanium), Ta (tantalum), Mo (molybdenum), and Co (cobalt). In one or more embodiments, the barrier layer material may comprise at least one element selected from the group consisting of N (nitrogen), C (carbon), and Si (silicon). In one or more embodiments, the barrier layer material may comprise (or may consist essentially of) one or more compounds. In one or more embodiments, the barrier layer material may comprise (or may consist essentially of) one or more metal compounds.

In one or more embodiments, the barrier layer 170 may be formed by a conformal deposition. In one or more embodiments, the barrier layer 170 may be formed by atomic layer deposition (ALD). In one or more embodiments, the barrier layer 170 may be formed by pulsed chemical vapor deposition (pulsed CVD). In an embodiment, one or more layers may be deposited as a thin amorphous layer (for example, less than about 2 nm), on which a microcrystalline species of the same or different stoichiometry may be grown to end up with the finally required total thickness.

The barrier layer may serve as a good diffusion barrier. Barrier layers comprising, for example, tungsten compounds may serve as diffusion barriers (possibly for Cu (copper)-containing materials). They may have good adhesion to silicon and to silicon oxides. $WF_6$ attack towards Si may be prevented because very low amounts of $WF_6$ (representative for just one adsorbed monolayer) may be adsorbed at the surface using ALD or pulsed CVD processes. The addition of Si-containing precursors (e.g. $SiH_4$) to the feed gas may also be beneficial. In an embodiment, when two or more precursors are used, they may be introduced alternatingly. In one or more embodiments, the barrier layer may help to prevent the intermixing of materials which are on opposite sides of the barrier layer.

In one or more embodiments, the stoichiometry of the barrier layer 170 may be graded. In one or more embodiments, the deposition may start out to have a lower W (tungsten) content and become W-richer as the deposition continues. Or, for example, the deposition may start out to have a higher W-content and become W-poorer as the deposition continues.

Sill referring to FIG. 5, a nucleation_seed layer 180 may be formed over the barrier layer 170. In one or more embodiments the nucleation_seed layer 180 may be formed on the barrier layer 170 so as to make direct contact. In one or more embodiments, the nucleation_seed layer 180 may have a thickness of about 20 nm or less. The nucleation_seed layer 180 may be formed by a conformal deposition. In one or more embodiments, the nucleation_seed layer 180 may be formed by an atomic layer deposition. In one or more embodiments, the nucleation_seed layer 180 may be formed by a pulsed chemical vapor deposition (pulsed CVD) process. The use of an ALD or a pulsed CVD process may provide for excellent conformality. In one or more embodiments, the nucleation_seed layer 180 may serve a nucleation or seed function for a subsequent deposition of the material forming the interconnect layer (which may, for example, comprise either pure copper and/or a copper alloy). In one or more embodiments, the nucleation_seed layer 180 may serve a nucleation or seed function for a subsequent electrochemical deposition of the material forming the interconnect layer.

In one or more embodiments, it is possible that nucleation_seed layer may also serve as a good diffusion barrier for Cu (copper).

In one or more embodiments, the nucleation_seed layer 180 may be a metallic layer. In one or more embodiments, the nucleation_seed layer 180 may comprise a metallic material. In one or more embodiments, the nucleation_seed layer 180 may consist essentially of a metallic material. In one or more embodiments, the metallic material may include at least one metallic element. In one or more embodiments, the metallic element may be selected from the Transition metals. In one or more embodiments, the metallic element may be an element selected from the refractory metals. In one or more embodiments, the metallic element may be an element selected from the group consisting of W (tungsten), Ti (titanium), Ta (tantalum), Mo (molybdenum), and Co (cobalt). In one or more embodiments, the metallic material may comprise W (tungsten) In one or more embodiments, the nucleation_seed layer may comprise (or consist essentially of) a pure metal and/or a metal alloy. In one or more embodiments, the nucleation_seed layer may comprise (or consist essentially of) one or more materials selected from the group consisting of pure tungsten, tungsten alloy, pure titanium, titanium alloy, pure molybdenum, molybdenum alloy, pure cobalt, and cobalt alloy. In one or more embodiments, the nucleation_seed layer 180 may comprise pure tungsten and/or a tungsten alloy. In one or more embodiments, the nucleation_seed layer 180 may consist essentially of pure tungsten and/or a tungsten alloy. In one or more embodiments, the nucleation_seed layer 160 may comprise pure tungsten. In one or more embodiments, the nucleation_seed layer 180 may consist essentially of pure tungsten.

Figure 6:
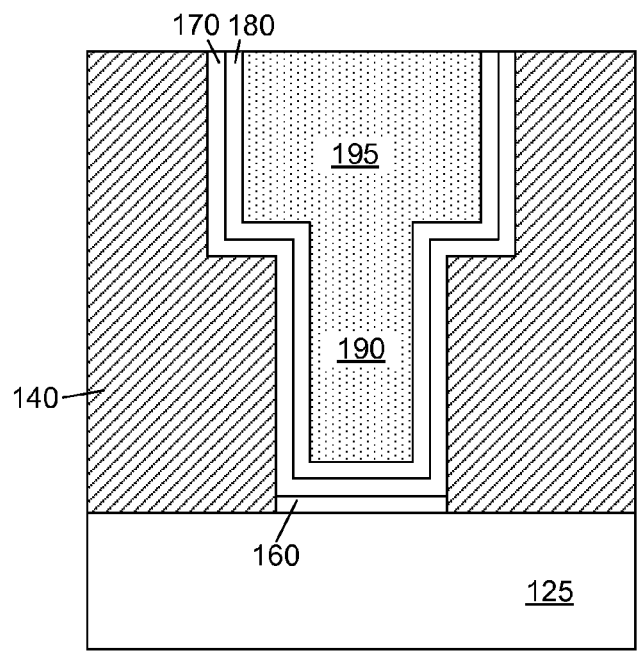

Referring to FIG. 6, the next step in the process is the formation of a conductive interconnect layer 190. The interconnect layer 190 may be formed within the opening 150 and over the nucleation_seed layer 180. In one or more embodiments, the interconnect layer may be formed on the nucleation_seed layer 180 so as to make direct contact.

Generally, the interconnect layer 190 may be formed of any conductive material. In one or more embodiments, the interconnect layer 190 may be a metallic layer. In one or more embodiments, the interconnect layer 190 may comprise one or more elements selected from the group consisting of Cu (copper), Au (gold), and Ag (silver). In one or more embodiments, the interconnect layer 190 may comprise one or more materials from the group consisting of pure copper, copper alloy, pure gold, gold alloy, pure silver, and silver alloy. Combinations of materials may also be used. In one or more embodiments, the interconnect layer 190 may comprise Cu (copper). The copper may be in the form of pure copper and/or copper alloy. Hence, in one or more embodiments, the interconnect layer may comprise pure copper and/or copper alloy. In one or more embodiments, the interconnect layer 190 may consist essentially of pure copper and/or copper alloy.

In one or more embodiments, the interconnect layer may be formed by an electrochemical deposition process. For example, it may be formed by an electroplating process. In the embodiment shown in FIG. 6, the process sequence may be performed as a dual Damascene approach. In this case, the dual Damascene approach deposits both an interconnect layer 190 as well as a conductive line (for example, metallic line) 195. The interconnect layer 190 may serve as a metallic interconnect layer electrically coupling the Si-containing layer 125 to the conductive (e.g. metallic) line 195. The conductive line 195 may be part of the first metallization level (Metallization Level-1). The deposition of the interconnect layer may be followed by a chemical mechanical polishing process for planarization.

In other embodiments, the deposition of the interconnect layer material (which may, for example, comprise pure copper and/or copper alloy) may be performed as a single Damascene process. This may be useful in the case of a very deep conductive interconnect (for example, conductive interconnect having a very high aspect ratio of height to width). In a single Damascene process only the interconnect opening may be filed with the interconnect layer material (such as pure copper and/or a copper alloy). The single Damascene process may provide more flexibility for choosing an appropriate material for the Metal-1 conductive line (for example, pure copper, copper alloy, pure aluminum, aluminum alloy, pure gold, gold alloy, pure silver, silver alloy, or something else may be used). In one or more embodiments, it is also possible that the conductive line of the first Metallization layer be formed from a conductive non-metallic material such as a doped polysilicon.

Optional preheat and/or pre-clean (chemical, reactive or sputter) steps might be performed before starting with the interconnect layer formation. In one or more embodiments, optional anneals may be performed after one or more of the formation steps of the contact layer, barrier layer and/or the nucleation_seed layer, or after the chemical mechanical polishing of the interconnect layer.

In one or more embodiments, the contact layer 160 (if used), the barrier layer 170 as well as the nucleation_seed layer 180 may all comprise one or more of the same metallic elements. Hence, in one or more embodiments, the contact layer 160 (if used), the barrier layer 170 as well as the nucleation_seed layer 180 may all comprise one or more common metallic elements. Generally, the one or more common metallic elements may be any metallic elements from the Periodic Table of Elements. In one or more embodiments, the one or more common metallic elements may be selected from the Transition Metal Elements (of the Periodic Table of Elements). In one or more embodiments, the one or more common metallic elements may be selected from the group consisting of W (tungsten), Ti (titanium), Ta (tantalum), Mo (molybdenum), and Co (cobalt). As an example, a common metallic element may be W (tungsten). In one or more embodiments, if the common metallic element is W (tungsten), the contact layer 160 may comprise (or consist essentially of) pure tungsten and/or a tungsten alloy. The barrier layer 170 may comprise (or consist essentially of) a compound including W (tungsten). The compound may be a binary compound or a ternary compound. The nucleation_seed layer 180 may comprise (or consist essentially of) pure tungsten and/or a tungsten alloy.

In other embodiments, the one or more common metallic elements may be any other metallic elements of the Periodic Table. In one or more embodiments, the one or more common metallic elements may be selected from the group consisting of W (tungsten), Ti (titanium), Ta (tantalum), Mo (molybdenum), and Co (cobalt).

In one or more embodiments, it possible that the contact layer (if used) and/or the barrier layer and/or the nucleation_seed layer include one or more metallic elements in addition to the one or more common metallic elements.

In one or more embodiments, the one or more common metallic elements may be the only metallic elements of the contact layer (if used), the barrier layer and the nucleation_seed layer. For example, if the common metallic element is W (tungsten) and this is the only metallic element used in all three layers, then the contact layer may comprise (or consist essentially of) pure tungsten, the barrier layer may comprise (or consist essentially of) at least one tungsten compound, and the nucleation_seed layer may comprise (or consist essentially of) pure tungsten. Examples of possible tungsten compounds for the barrier layer have been described above.

It is possible that when the contact layer, barrier layer and nucleation_seed layer comprise one or more common metallic elements, the process steps which provide the contact layer, the barrier and the nucleation_seed layer may be carried out in the same tool or, possibly, in the same chamber of a tool (or in adjacent chambers). It is possible that the same basic chemicals and precursors may be used for the formation of each of the contact layer, the barrier layer and the nucleation_seed layer. In one or more embodiments, it may thus be possible that at least two of the contact layer, the barrier layer and the nucleation_seed layer may be formed without having to expose the semiconductor device substrate or semiconductor device (in some stage of completion) to ambient conditions (for example, to the ambient atmosphere). For example, after the formation of one of the layers, the process to form a following layer may be formed without expositing the semiconductor device substrate (or semiconductor device in some stage of completion) to ambient conditions (for example, to the ambient atmosphere).

The use of atomic layer deposition (ALD) and/or pulsed chemical vapor deposition (pulsed CVD), may provide excellent conformality and scalability. Barrier and nucleation_seed layers may be kept relatively thin, enabling that the subsequently deposited copper (for example, pure copper or copper alloy) covers the largest volume of the interconnect structure.

Hence, in one or more embodiments, the contact layer, the barrier layer and the nucleation_seed layer may be deposited by an atomic layer deposition (ALD) and/or pulsed chemical vapour deposition (pulsed CVD) process and may use the same basic chemical precursor, making it very attractive for low-cost, high volume fabrications.

Figure 7:
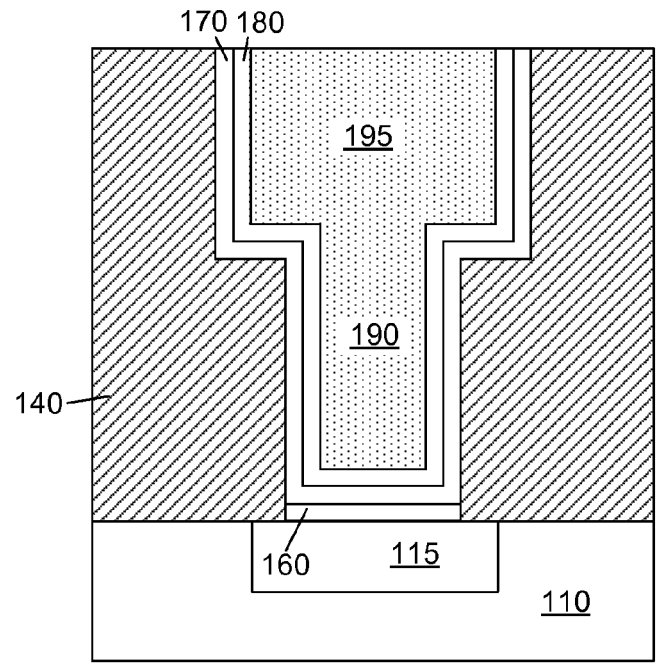
FIG. 7 shows an embodiment of a semiconductor device in accordance with an embodiment of the present invention.

Referring to FIG. 6, the Si-containing layer 125 may be any layer comprising Si (the element silicon from the Periodic Table). For example, the Si-containing layer may represent a silicon substrate. The Si-containing layer 125 shown in FIG. 6 may also represent, for example, a doped silicon layer within a substrate. This is shown in FIG. 7 which shows a doped silicon layer 115 formed in a substrate 110. The substrate 110 may be any semiconductor substrate such as a silicon substrate. In one or more embodiments, the interconnect layer 190 may electrically couple the doped silicon layer 115 to a conductive (e.g. metallic) of the first metallization level. In one or more embodiments, the interconnect layer 190 may electrically couple the substrate 110 to a conductive (e.g. metallic) line of the first metallization level.

Figure 8:
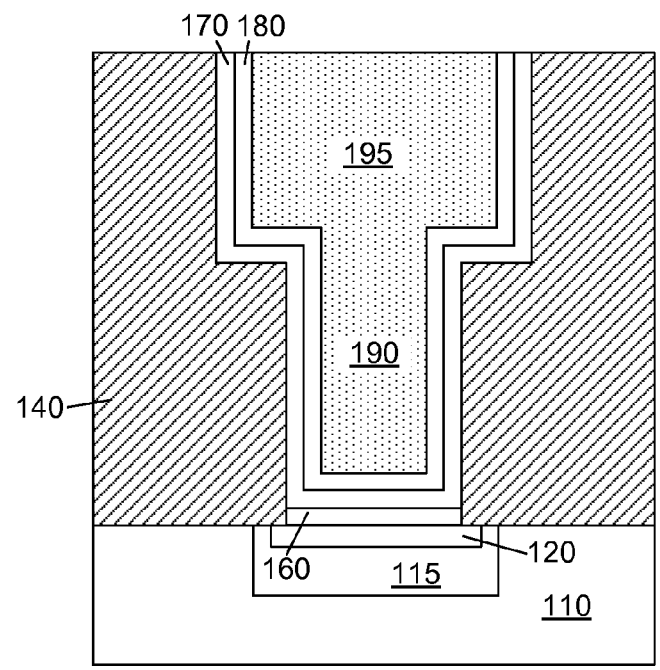
FIG. 8 shows an embodiment of a semiconductor device in accordance with an embodiment of the present invention.

The Si-containing layer 125 shown in FIG. 6 may also represent, for example, a silicide such as a metal silicide. This is shown in FIG. 8 where a silicide layer 120 has been formed within and/or on a silicon substrate 110. In the embodiment shown in FIG. 8, a silicide layer 120 may be formed within and/or on a doped silicon layer 115. The silicide layer 120 may be any metal silicide. In one or more embodiments, the metal silicide may be selected from the group consisting of titanium silicide, tungsten silicide, tantalum silicide, molybdenum silicide, and cobalt silicide. In one or more embodiments, the interconnect layer 190 may electrically couple the doped silicon layer 115 to a conductive (e.g. metallic) line of the first metallization level. In one or more embodiments, the interconnect layer 190 may electrically couple the substrate 110 to a conductive (e.g. metallic) line of the first metallization level.

The doped silicon layer 115 shown in FIGS. 7 and 8 may, for example, be a doped monocrystalline silicon. The doped silicon layer may be p-doped and/or n-doped.

As shown in FIG. 7, it is possible that the contact layer 160 be formed on top of a doped silicon region 115. In one or more embodiments, it is possible, to heat the structure above a certain temperature (for example, possibly above about 600° C.) to form a metal silicide from the reaction between the doped silicon region 115 and the contact layer 160. In an embodiment, it is possible that a top portion of the contact layer 160 shown in FIG. 7 still remains while a bottom portion may be converted to a metal silicide. In another embodiment, it is possible that the entire contact layer 160 may be converted to a metal silicide.

Figure 9:
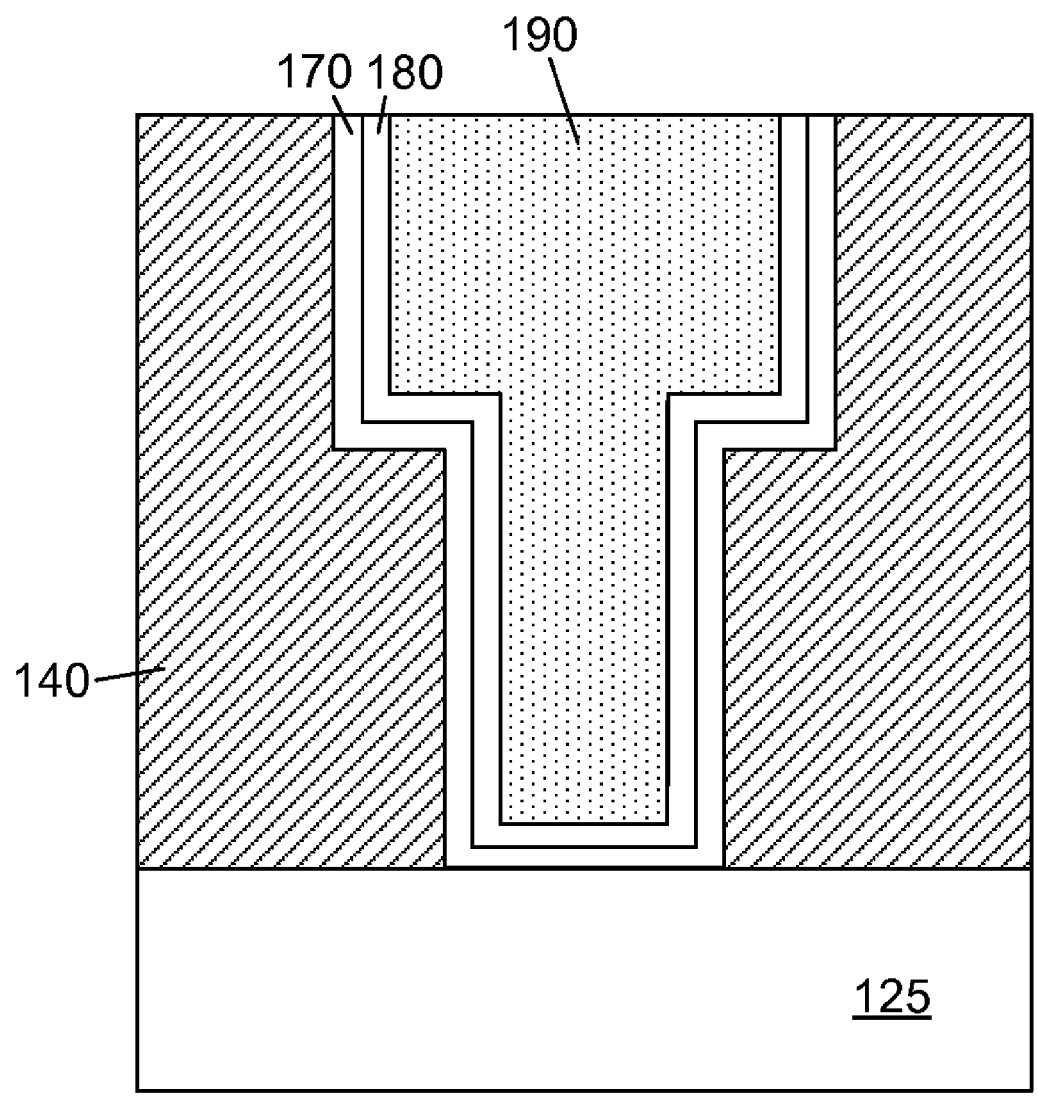
FIG. 9 shows an embodiment of a semiconductor device in accordance with an embodiment of the present invention.

Referring to FIG. 9, in another embodiment of the invention, it is possible that the contact layer 160 is not used. In this case, the barrier layer 170 may be formed over the Si-containing layer without the contact layer. In one or more embodiments, the barrier layer 170 may be formed on the Si-containing layer so as to be in direct contact with the Si-containing layer. In an embodiment, this may be useful when then Si-containing layer is a silicide.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor device, comprising:
    a Si-containing layer;
    a metallic contact layer disposed over and in direct contact with said Si-containing layer, said contact layer comprising a pure metal and/or a metal alloy, said pure metal and/or metal alloy comprising a metallic element;
    a barrier layer disposed over said contact layer, said barrier layer comprising a compound including said metallic element;
    a metallic nucleation_seed layer disposed over said barrier layer, said nucleation_seed layer including said metallic element; and
    a metallic interconnect layer disposed over said nucleation_seed layer, said interconnect layer comprising at least one element selected from the group consisting of Cu (copper), Au (gold), and Ag (silver).

2. The device of claim 1, wherein said interconnect layer comprises Cu (copper).

3. The device of claim 2, wherein said interconnect layer comprises pure copper and/or a copper alloy.

4. The device of claim 1, wherein said metallic element is an element selected from the group consisting of W (tungsten), Ti (titanium), Ta (tantalum), Mo (molybdenum), and Co (cobalt).

5. The device of claim 1, wherein said metallic element is W (tungsten).

6. The device of claim 1, wherein said Si-containing layer comprises a silicide and/or a doped silicon.

7. The device of claim 1, wherein said contact layer is in direct contact with said Si-containing layer, said barrier layer is in direct contact with said contact layer, said nucleation_seed layer is in direct contact with said barrier layer, and said interconnect layer is in direct contact with said nucleation_seed layer.

8. The device of claim 1, wherein said contact layer comprises pure tungsten, said barrier layer comprises a tungsten compound and said nucleation_seed layer comprises pure tungsten.

9. The device of claim 1, wherein said contact layer comprises pure tungsten and/or a tungsten alloy, said barrier layer compound comprises W (tungsten) and said nucleation_seed layer comprises pure tungsten and/or a tungsten alloy.

10. The device of claim 1, wherein said compound further comprises at least one element selected from the group consisting of N (nitrogen), C (carbon), and Si (silicon).

11. The device of claim 1, further comprising a dielectric layer having an opening, said opening disposed over said Si-containing layer, said barrier layer disposed within said opening over said Si-containing layer.

12. The device of claim 1, further comprising a dielectric layer having an opening, said opening disposed over said Si-containing layer, said contact layer disposed within said opening over said Si-containing layer, said barrier layer disposed within said opening over said contact layer and in direct contact with a sidewall surface of said opening, said nucleation_seed layer disposed within said opening over barrier layer, and said interconnect layer disposed within said opening over said nucleation_seed layer.

13. A semiconductor device, comprising:
 a Si-containing layer;
 a dielectric layer having an opening, said opening disposed over said Si-containing layer;
 a contact layer disposed within said opening and in direct contact with said Si-containing layer, said contact layer comprising a pure metal and/or a metal alloy, said pure metal and/or metal alloy comprising a metallic element;
 a barrier layer disposed within said opening over said contact layer and in direct contact with a sidewall surface of said opening, said barrier layer comprising at least one compound including said metallic element;
 a metallic nucleation_seed layer disposed within said opening over said barrier layer, said nucleation_seed layer including said metallic element; and
 a metallic interconnect layer disposed within said opening over said nucleation_seed layer, said interconnect layer comprising at least one element selected from the group consisting of Cu (copper), Au (gold), and Ag (silver).

14. The device of claim 13, wherein said interconnect layer comprises Cu (copper).

15. The device of claim 13, wherein said interconnect layer comprises pure copper and/or a copper alloy.

16. The device of claim 13, wherein said metallic element is an element selected from the group consisting of W (tungsten), Ti (titanium), Ta (tantalum), Mo (molybdenum), and Co (cobalt).

17. The device of claim 13, wherein said metallic element is W (tungsten).

18. The device of claim 13, wherein said Si-containing layer comprises a silicide and/or a doped silicon.

19. The device of claim 13, wherein said contact layer is in direct contact with said Si-containing layer, said barrier layer is in direct contact with said contact layer, said nucleation_seed layer is in direct contact with said barrier layer, and said interconnect layer is in direct contact with said nucleation_seed layer.

20. The device of claim 13, wherein said contact layer comprises pure tungsten, said barrier layer comprises a tungsten compound and said nucleation_seed layer comprises pure tungsten.

21. The device of claim 13, wherein said contact layer comprises pure tungsten and/or a tungsten alloy, said barrier layer compound comprises W (tungsten) and said nucleation_ seed layer comprises pure tungsten and/or a tungsten alloy.

22. The device of claim 13, wherein said compound further comprises at least one element selected from the group consisting of N (nitrogen), C (carbon), and Si (silicon).

23. The device of claim 1, wherein said contact layer comprises a pure metal.

24. The device of claim 13, wherein said contact layer comprises a pure metal.

25. The device of claim 1, wherein said barrier layer includes at least one material selected from the group consisting of tungsten carbide, tungsten nitride, tungsten carbonitride, tungsten silicon nitride, tungsten silicon carbide, and tungsten silicon carbonitride.

26. The device of claim 13, wherein said barrier layer includes at least one material selected from the group consisting of tungsten carbide, tungsten nitride, tungsten carbonitride, tungsten silicon nitride, tungsten silicon carbide, and tungsten silicon carbonitride.

* * * * *